(12) United States Patent
Sood

(10) Patent No.: US 8,766,701 B1
(45) Date of Patent: Jul. 1, 2014

(54) ANALOG MULTIPLEXING WITH INDEPENDENT POWER SUPPLIES

(71) Applicant: Xilinx, Inc., San Jose, CA (US)

(72) Inventor: Santosh Kumar Sood, New Delhi (IN)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 13/791,566

(22) Filed: Mar. 8, 2013

(51) Int. Cl.
*H03K 17/00* (2006.01)

(52) U.S. Cl.
USPC .............. 327/410; 326/39; 326/40; 326/41; 327/411; 327/412

(58) Field of Classification Search
USPC ................................................ 327/407–418
See application file for complete search history.

(56) References Cited

U.S. PATENT DOCUMENTS

| | | | | |
|---|---|---|---|---|
| 4,985,703 A | * | 1/1991 | Kaneyama | 341/141 |
| 5,410,192 A | * | 4/1995 | Yamada | 327/408 |
| 6,147,520 A | * | 11/2000 | Kothandaraman et al. | 327/77 |
| 6,348,831 B1 | * | 2/2002 | Baba | 327/537 |
| 6,373,291 B1 | * | 4/2002 | Hamada et al. | 326/113 |
| 6,819,141 B1 | * | 11/2004 | Qi et al. | 326/119 |
| 6,998,872 B1 | * | 2/2006 | Chirania et al. | 326/40 |
| 7,064,576 B1 | * | 6/2006 | Maangat | 326/30 |
| 7,176,710 B1 | * | 2/2007 | Luo et al. | 326/30 |
| 7,221,185 B1 | * | 5/2007 | Yu et al. | 326/38 |
| 7,234,069 B1 | * | 6/2007 | Johnson | 713/400 |
| 8,471,591 B2 | * | 6/2013 | Gillingham | 326/30 |
| 2002/0101278 A1 | * | 8/2002 | Schultz et al. | 327/543 |

* cited by examiner

*Primary Examiner* — Brandon S Cole
(74) *Attorney, Agent, or Firm* — W. Eric Webostad

(57) ABSTRACT

An apparatus relating generally to an analog multiplexer is disclosed. In such an apparatus, the analog multiplexer has first select circuits and at least one second select circuit. The first select circuits have respective input nodes and output nodes. The output nodes are all coupled to one another to provide an output node of the analog multiplexer. The first select circuits are coupled to a first supply voltage of a first supply domain. The at least one second select circuit is coupled to a second supply voltage of a second supply domain different from the first supply domain. The at least one second select circuit has an input port and an output port. The output port is coupled to an input node of the input nodes.

15 Claims, 7 Drawing Sheets

ANALOG MULTIPLEXING WITH INDEPENDENT POWER SUPPLIES

FIELD OF THE INVENTION

The following description relates to integrated circuit devices ("ICs"). More particularly, the following description relates to an analog multiplexer for an IC.

BACKGROUND

An analog multiplexer may support multiple channels. For an analog multiplexer on a semiconductor die ("chip"), there may be different power supply voltages used to generate various analog signals on such die. However, for an analog multiplexer operated using a first supply voltage, an analog signal input generated from a second supply voltage provided as an input to such analog multiplexer may present a problem in regards to a power sequencing constraint. In other words, if such second supply voltage ramps up before such first supply voltage, then an input analog signal provided as input to such analog multiplexer prior to such first supply voltage at least reaching a threshold level of voltage ("threshold voltage level") may cause an error condition, namely forward biasing what should be a reverse biased drain-to-substrate junction.

Accordingly, it would be useful to provide an analog multiplexer that has a less constrained power sequencing constraint.

SUMMARY

An apparatus relates generally to an analog multiplexer. In such an apparatus, the analog multiplexer has first select circuits and at least one second select circuit. The first select circuits have respective input nodes and output nodes. The output nodes are all coupled to one another to provide an output node of the analog multiplexer. The first select circuits are coupled to a first supply voltage of a first supply domain. The at least one second select circuit is coupled to a second supply voltage of a second supply domain different from the first supply domain. The at least one second select circuit has an input port and an output port. The output port is coupled to an input node of the input nodes.

A method relates generally to operation of an analog multiplexer. In such a method, an analog multiplexer is provided which has first select circuits and at least one second select circuit. The first select circuits have respective input nodes and output nodes. The output nodes are all coupled to one another to provide an output node of the analog multiplexer. The first select circuits are coupled to a first supply voltage of a first supply domain. The at least one second select circuit is coupled to a second supply voltage of a second supply domain different from the first supply domain. The at least one second select circuit has an input port and an output port. The output port is coupled to an input node of the input nodes. An input signal is input to the input port of the at least one second select circuit. The input signal is generated with the second supply voltage. Passage of the input signal through the at least one second select circuit is blocked until the first supply voltage has ramped up to at least a threshold voltage level.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

FIG. 3-1 is a block diagram depicting an exemplary analog multiplexer.

FIG. 3-2 is a block diagram depicting another exemplary analog multiplexer.

DETAILED DESCRIPTION

Figure 1:
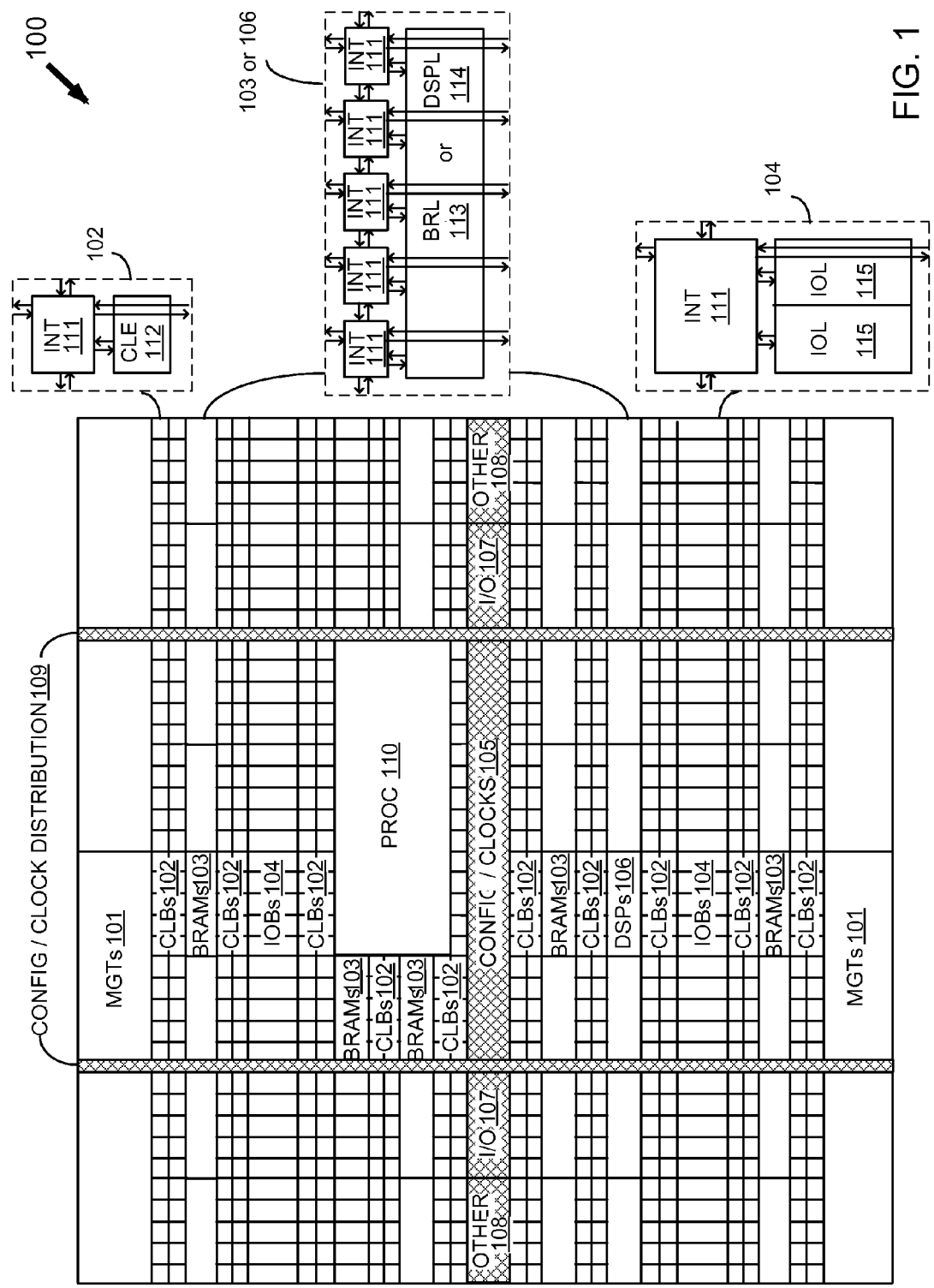
FIG. 1 is a simplified block diagram depicting an exemplary embodiment of a columnar Field Programmable Gate Array ("FPGA") architecture.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Before describing the examples illustratively depicted in the several figures, a general introduction is provided to further understanding.

For an analog test mode, where an analog voltage may be exposed on a test or probe pad ("pad") during such test mode, an analog multiplexer having multiple channels may be limited as to what analog signals may be tested. In other words, analog signals generated from different voltage supplies heretofore may have had to be provided to different analog multiplexers according to such voltage supplies. Thus, conventionally a chip may have had a separate analog multiplexer for each power supply domain to provide separate pads for test signals in various power domains. In addition to more analog multiplexers, this also may add overhead associated with adding one or more other pads to be bonded out of such chip.

A single analog multiplexer may be capable of handling input signals from multiple power supply domains provided a power sequencing constraint is met. Along those lines, all exposed input voltages to such analog multiplexer would be powered up only after a supply voltage used to operate such analog multiplexer had ramped up at least to a threshold voltage level. This would be used to prevent forward biasing of body diodes in PMOS transistors of such analog multiplexer. However, this transfers the onus onto a tester to respect such a power sequencing constraint, which increases test program complexity and cost. Moreover, for a user of such a chip, this may impose an additional burden on powering up a chip if analog voltages of input signals of different power supply domains are provided as inputs to a same analog multiplexer.

As described below in additional detail, to avoid such overhead, a power sequence independent analog multiplexing system is described. Such analog multiplexing system may be used with existing integration of a conventional analog multiplexer. This facilitates extension of analog tests and provides power sequencing independence of analog tests or other analog voltages in a conventional analog multiplexer. Along those lines, power sequencing independence is provided by gating unrelated analog exposed signals with a power-on-reset ("POR") signal of such unrelated power domain with respect to operation of such conventional analog multiplexer. Such POR signal is referenced to another POR or ramp up signal of a power domain related to operation of such conventional analog multiplexer, which ramp up signal may not be de-asserted until a supply voltage of such related power domain crosses a defined threshold voltage.

With the above general understanding borne in mind, various embodiments for an analog multiplexing system are generally described below.

Because one or more of the above-described examples are described herein using a particular type of IC, a detailed description of such an IC is provided below. However, it should be understood that other types of ICs may benefit from one or more of the techniques described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

As noted above, advanced FPGAs can include several different types of programmable logic blocks in the array. For example, FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output blocks ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element in each adjacent tile. Therefore, the programmable interconnect elements taken together implement the programmable interconnect structure for the illustrated FPGA. The programmable interconnect element 111 also includes the connections to and from the programmable logic element within the same tile, as shown by the examples included at the top of FIG. 1.

For example, a CLB 102 can include a configurable logic element ("CLE") 112 that can be programmed to implement user logic plus a single programmable interconnect element ("INT") 111. A BRAM 103 can include a BRAM logic element ("BRL") 113 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 106 can include a DSP logic element ("DSPL") 114 in addition to an appropriate number of programmable interconnect elements. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 typically are not confined to the area of the input/output logic element 115.

In the pictured embodiment, a horizontal area near the center of the die (shown in FIG. 1) is used for configuration, clock, and other control logic. Vertical columns 109 extending from this horizontal area or column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, processor block 110 spans several columns of CLBs and BRAMs.

Note that FIG. 1 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 1 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

Figure 2:
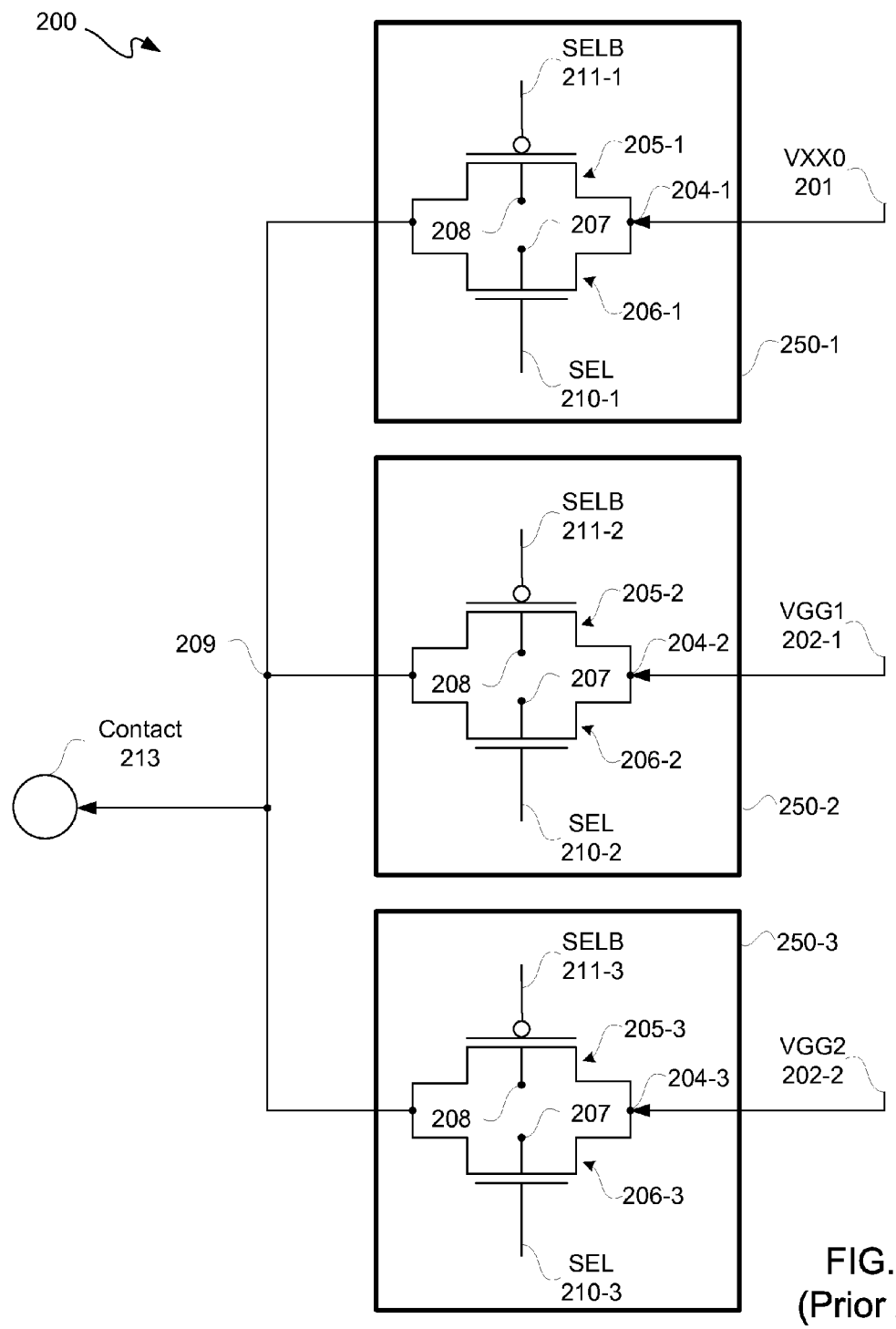
FIG. 2 is a block/circuit diagram depicting an exemplary conventional analog multiplexer.

Prior to a detailed description of proposed exemplary analog multiplexers, a more detailed description of a conventional analog multiplexer is provided for purposes of clarity. Along those lines, FIG. 2 is a block/circuit diagram depicting an exemplary conventional analog multiplexer 200. Analog multiplexer 200 includes multiplexer or select circuits 250-1 through 250-3 ("select circuits 250"). Even though three select circuits 250 are illustratively depicted, two or more than three select circuits 250 may be present in other configurations of analog multiplexer 200.

Select circuits 250 respectively include input nodes 204-1 through 204-3 ("input nodes 204"). Input nodes 204 are respectively coupled to common first source/drain nodes of pairs of pass gate transistors of select circuits 250, and output nodes 209-1 through 209-3, respectively of select circuits 250-1 through 250-3, are coupled to one another to provide a common output node 209, namely output node 209 is coupled to common second source/drain nodes 209-1 through 209-3 of such pairs of pass gate transistors of select circuits 250. Output node 209 may be coupled to a contact 213, such as an I/O pad, a probe pad, or an output pad for example.

Each of select circuits 250 includes a respective PMOS pass gate transistor 205-1 through 205-3 ("PMOS pass gate transistors 205") and a respective NMOS pass gate transistor 206-1 through 206-3 ("NMOS pass gate transistors 206"). Gates of NMOS pass gate transistors 206 are respectively coupled to receive select signals 210-1 through 210-3 ("select signals 210"), and gates of PMOS pass gate transistors 205 are respectively coupled to receive select signals 211-1 through 211-3 ("select signals 211"). Select signals 211 are respective complements of select signals 210.

Even though opposite polarity transistors are described and illustratively depicted herein for pass gate transistors to form select circuits, and these or other types of transistors may be used. However, for purposes of clarity by way of example and not limitation, it shall be assumed that opposite clarity transistors are used for select circuits throughout the remainder of this description.

Body regions of PMOS pass gate transistors 205 are all coupled to a supply voltage node 208, and body regions of NMOS pass gate transistors 206 are all coupled to ground voltage node 207. For purposes of clarity by way of example not limitation, it shall be assumed that supply voltage node 208 is of a VCC supply voltage, such as VCCAUX for example. However, in other configurations other supply voltage domains may be used.

Each of PMOS transistors 205 may be operated in a supply voltage domain associated with such VCC supply voltage. A source for such VCC supply voltage may be an on-chip or off-chip regulated voltage, and along those lines it should be appreciated that the source of such VCC supply voltage may be externally provided.

For purposes of clarity by way of example not limitation, select circuit 250-1 is described in detail, as the description of other select circuits 250 follows from the following description of select circuits 250-1. A source/drain region or node of each of pass gate transistors 205-1 and 206-1 is coupled to an input node 204-1. A body region of PMOS pass gate transistor 205-1 is coupled to a supply voltage node 208. A body region of NMOS pass gate transistor 206-1 is coupled to a ground node 207. A gate of PMOS pass gate transistor 205-1 is coupled to receive a select bar signal ("SELB") 211-1, and a gate of NMOS pass gate transistor 206-1 is coupled to receive a select signal ("SEL") 210-1. Select signals 210-1 and 211-1 are complements of one another and are based upon or generated within a VCC supply voltage domain. A source/drain region of each of transistors 205-1 and 206-1 is coupled to output node 209.

Because PMOS pass gate transistors 205 are all operating within a VCC supply voltage domain, input signals also within such a VCC supply voltage domain are compatible with operation of analog multiplexer 200. For example, an input signal 202-1 and an input signal 202-2, such as respectively VGG1 and VGG2 for example, respectively provided to input nodes 204-2 and 204-3 may be correctly selectively passed to output node 209 respectively through select circuits 250-2 and 250-3. However, an input data signal 201, such as for example VXX0, provided to input node 204-1 may not be correctly selectively passed to output node 209 through select circuits 250-1, because input data signal 201 is based upon or generated within a voltage input ("VIN") supply voltage domain which is not a VCC supply voltage domain. Along those lines, source voltages used to provide a VCC supply voltage domain and a VIN supply voltage domain may be separate sources, such as for example separate pins on a chip coupled to separate supply voltage inputs, whether regulated on or off chip.

Suppose for example, for analog multiplexer 200 in an analog test mode, a test voltage of an input data signal 201, where such input data signal 201 is for example an internal test mode signal generated from a regulator using an supply voltage VIN which is independent of a supply voltage VCCAUX used to power analog multiplexer 200, input data signal 201 ramps up before such supply voltage VCCAUX. This ramping up of input data signal 201 before supply voltage VCCAUX results in a drain of PMOS transistor 205-1 being at higher voltage than a body region of such transistor. In other words, body diode of PMOS transistor 205-1 may be forward biased causing an error condition.

Figures 1, 3:
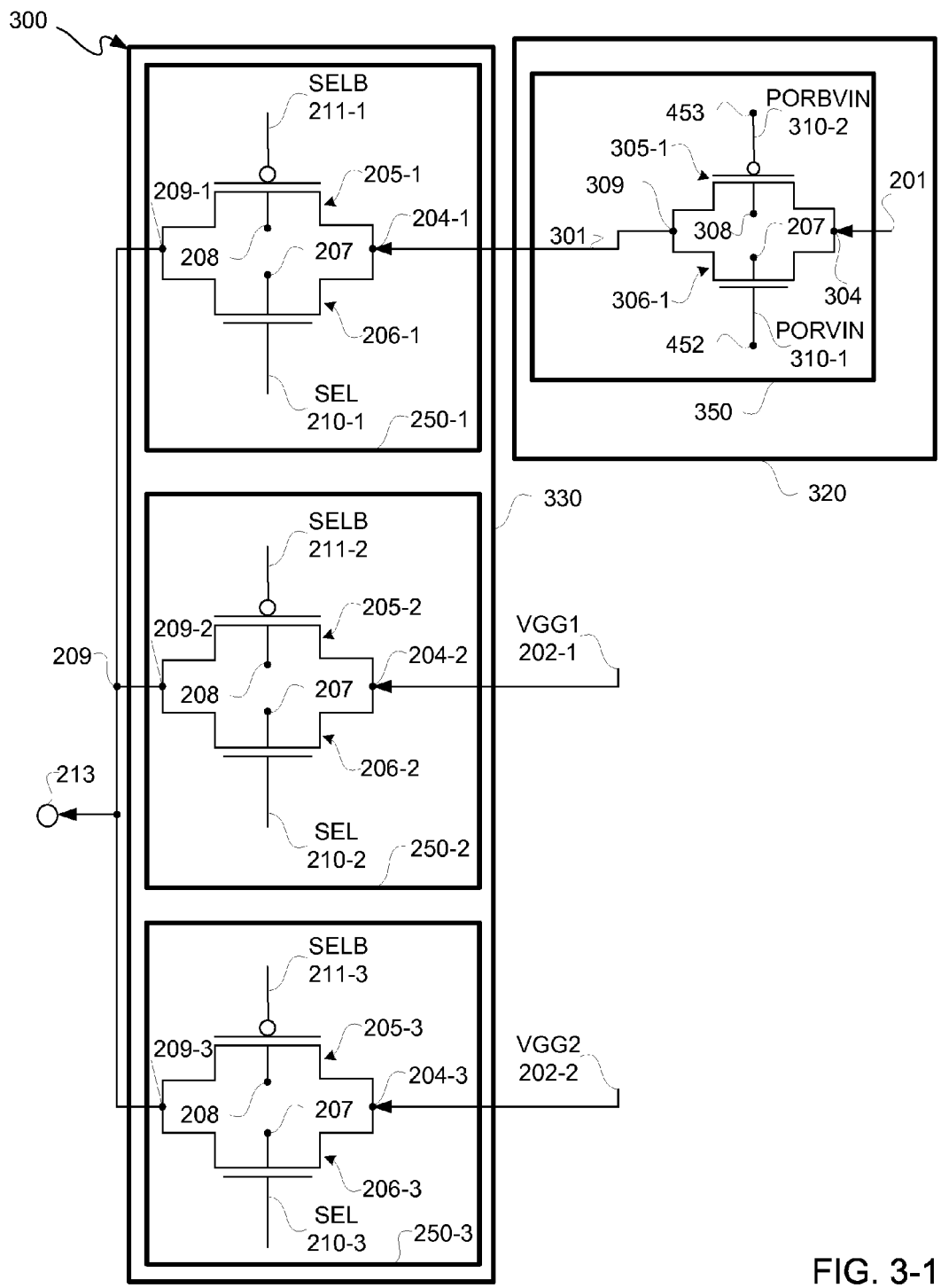
Figures 2, 3:
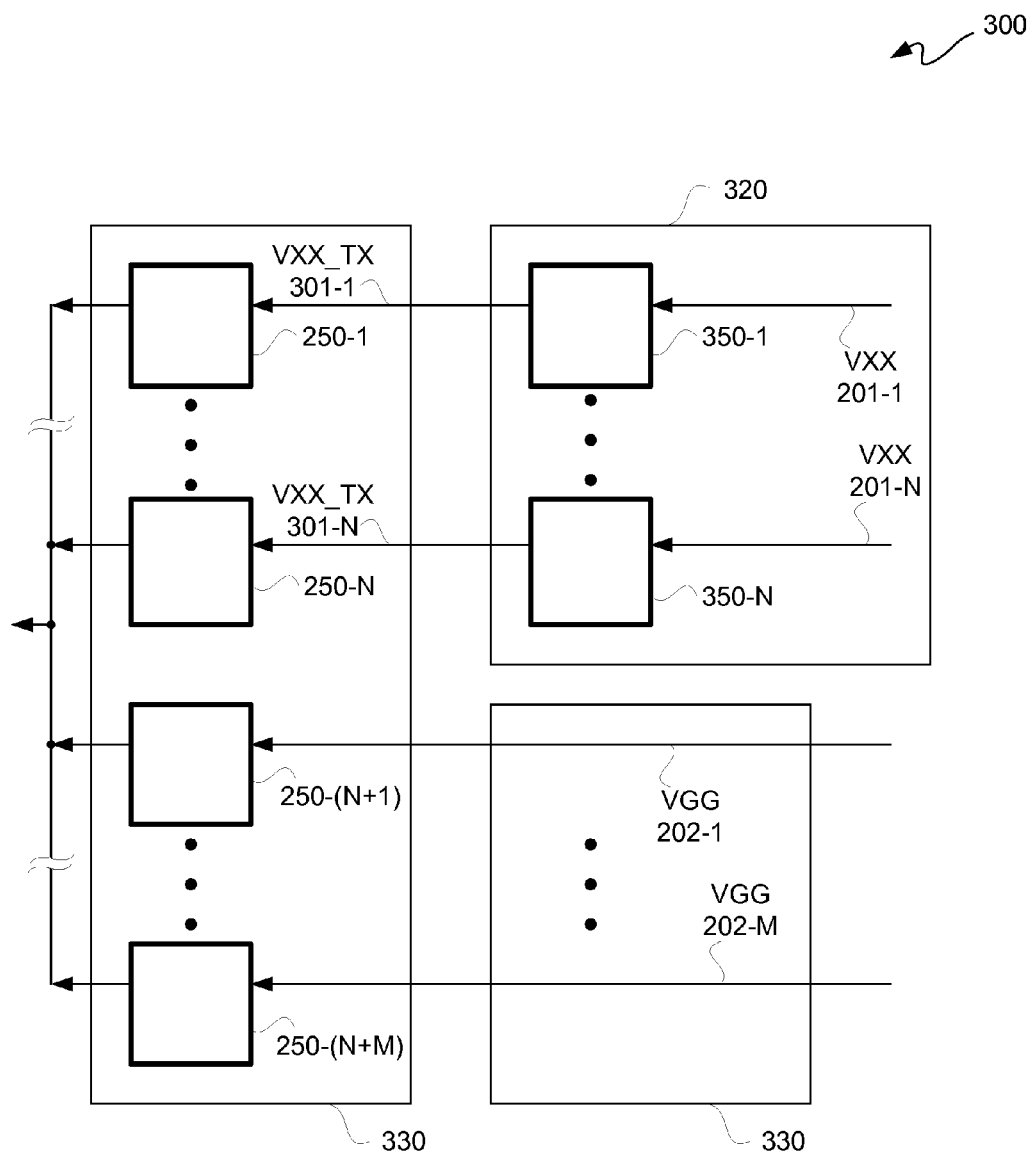

FIG. 3-1 is a block diagram depicting an exemplary analog multiplexer 300. Analog multiplexer 300 may be analog multiplexer 200 of FIG. 2 with the addition of select circuit 350. Accordingly, for purposes of clarity, duplicate description is not repeated. However, it should be understood that a select circuit 350 may be provided for each input analog data signal generated from an unrelated power domain with respect to a power domain used to operate analog multiplexer 200. This allows a conventional multiplexer 200 to be used as part of analog multiplexer 300 with analog voltages of input signals generated from different power domains. Each select circuit 350 may be hardware added to any IC, including without limitation FPGA 100 of FIG. 1, having at least one conventional analog multiplexer 200. Optionally, programmable resources of FPGA 100 may be used to provide each select circuit 350, where FPGA 100 includes one or more dedicated analog multiplexers 200.

Select circuit 350, which is in a VIN supply voltage domain 320, includes a PMOS pass gate transistor 305-1 and an NMOS pass gate transistor 306-1. A source/drain region of each of pass gate transistors 305-1 and 306-1 may be coupled to an input port or input node 304. Input node 304 may be coupled to receive input data ("VXX0") signal 201 of VIN supply voltage domain 320. A body region of PMOS pass gate transistor 305-1 may be coupled to a supply voltage node 308. Supply voltage node 308 may be coupled to a VIN supply voltage of a VIN supply voltage domain 320. A body region of NMOS pass gate transistor 306-1 may be coupled to a ground node 207. A gate of PMOS pass gate transistor 305-1 may be coupled to receive a power-on-reset bar voltage input signal ("PORBVIN") 310-2 of VIN supply voltage domain 320, and a gate of NMOS pass gate transistor 306-1 may be coupled to receive a power-on-reset voltage input signal ("PORVIN") 310-1 of VIN supply voltage domain 320. Voltage input signals 310-1 and 310-2 are complements of one another and are based upon or generated using VIN supply voltage. A gate or input node 452, as described below in additional detail, of analog multiplexer 300 may be coupled to receive PORVIN 310-1, and a gate or input node 453, as described below in additional detail, of analog multiplexer 300 may be coupled to receive PORBVIN 310-2. A source/drain region of each of transistors 305-1 and 306-1 may be coupled to output port or output node 309 of select circuit 350. Output node 309 may be coupled to input node 204-1 of select circuit 250-1. An output signal 301, such as a VXX0_TX signal, from output node 309 may be provided as an input signal to input node 204-1 though controlled for use in VCC supply voltage domain 330 of select circuits 250.

FIG. 3-2 is a block diagram depicting another exemplary analog multiplexer 300. Analog multiplexer 300 may be analog multiplexer 300 of FIG. 3-1 with addition of one or more select circuits. Accordingly, for purposes of clarity, duplicate description is not repeated.

More particularly, input data signals 201-1 through 201-N, for N a positive integer greater than one, of VIN supply voltage domain 320 may be respectively provided as data input signals to select circuits 350-1 through 350-N. Output signals 301-1 through 301-N of VIN supply voltage domain 320 may be respectively sourced data output signals of select circuits 350-1 through 350-N. Output signals 301-1 through 301-N may be respectively provided as input data signals to select circuits 250-1 through 250-N of VCC supply voltage domain 330.

Input signals 202-1 through 202-M, for M a positive integer greater than one, of VCC supply voltage domain 330 may be respectively provided as data input signals to select circuits 350-(N+1) through 350-(N+M). Input signals 202-1 through 202-M for example may be VGG signals of VCC supply voltage domain 330.

Figure 4:
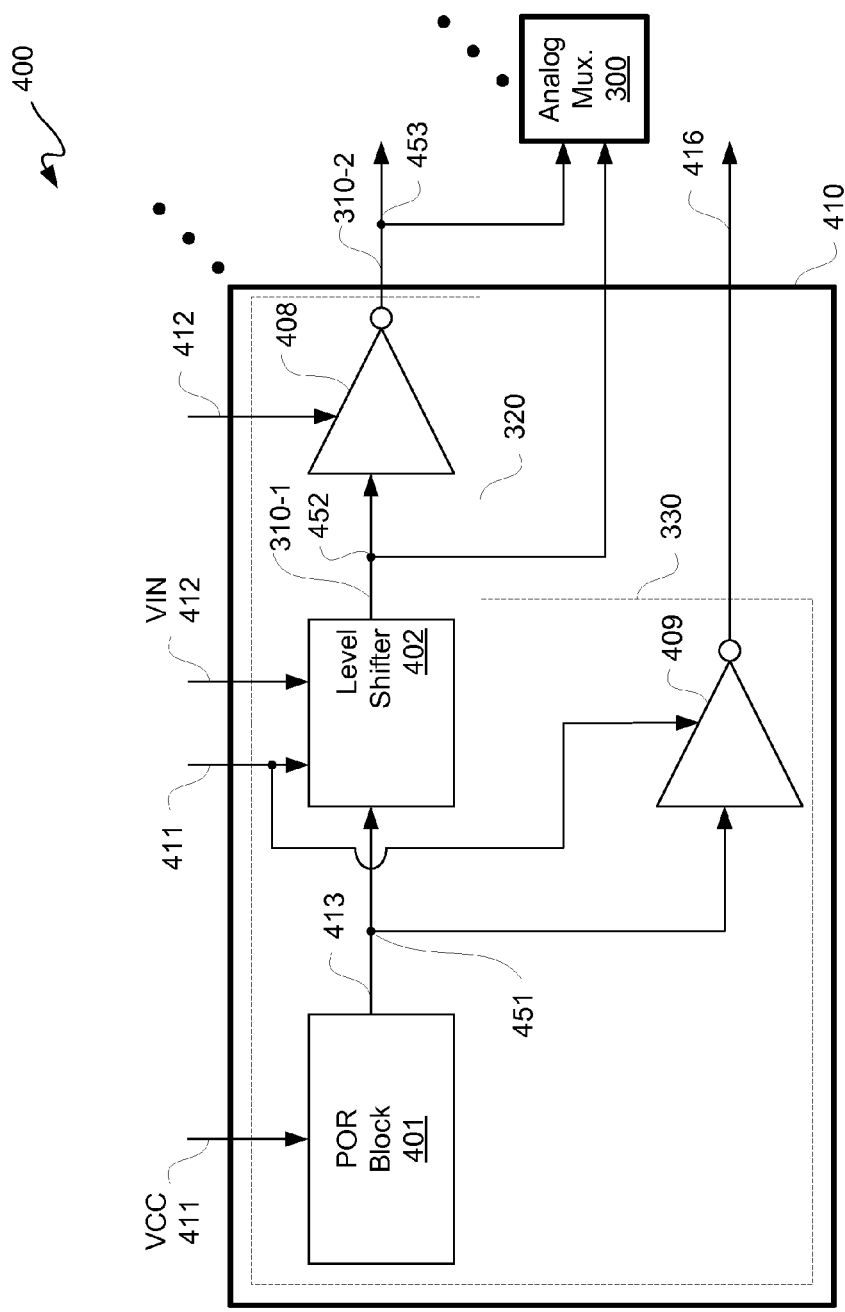
FIG. 4 is a block/circuit diagram depicting an exemplary an analog multiplexing system.

FIG. 4 is a block/circuit diagram depicting an exemplary an analog multiplexing system 400. Analog multiplexing system 400 may include one or more analog multiplexers 300 and one or more voltage monitoring circuits ("voltage monitors") 410. Along those lines, a voltage monitor 410 may support two supply voltage domains, such as for example a VCC supply voltage domain 330 and a VIN supply voltage domain 320, and such supply voltage domains may be associated with one or more analog multiplexers 300. Furthermore, there may be more than two supply voltage domains, and accordingly more than one voltage monitor 410 may be used. However, for purposes of clarity by way of example and not limitation, it shall be assumed that only two supply voltage domains are used for analog multiplexing, even though in other configurations more than two supply voltage domains may be used for analog multiplexing.

Voltage monitor 410 includes a power-on-reset circuit block ("POR block") 401 and an inverter 409 which are in VCC supply voltage domain 330. Voltage monitor 410 further includes a level shifter 402, an input portion of which may be in VCC supply voltage domain 330 and an output portion of which may be in VIN supply voltage domain 320. Additionally, voltage monitor 410 includes inverter 408, which may be in VIN supply voltage domain 320.

Voltage monitor 410 may be coupled to receive a VCC supply voltage 411 from VCC supply voltage domain 330 and a VIN supply voltage 412 from VIN supply voltage domain 320. Voltage monitor 410 may be configured to generate a PORVIN or voltage input signal 310-1 and a PORBVIN or voltage input signal 310-2 for respectively providing to pass gates of at least one select circuit of analog multiplexer 300, as previously described with reference to FIGS. 3-1 and 3-2. Thus, as previously described, voltage input signals 310 may be used to respectively pass gate a select circuit 350 of analog multiplexer 300.

POR block 401 receives VCC supply voltage 411 for ramping up operation. Output of POR block 401 is a POR VCC-based ramp up signal ("PORVCC signal") 413 provided to internal node 451. PORVCC signal 413 may be a known brownout/POR signal from a known POR block 401 for monitoring a supply voltage, such as VCCAUX. Node 451 is coupled to input ports of level shifter 402 and inverter 409, and so PORVCC signal 413 is provided as an input to level shifter 402 and to inverter 409. Inverter 409, which is biased with VCC supply voltage 411, outputs an inverted or complemented version of PORVCC signal 413, namely PORBVCC signal 416. PORVCC signal 413 and PORBVCC signal 416 may be used for generating select signals of analog multiplexer 300, such as select signals 210 and 211, respectively.

PORVCC signal 413 input to level shifter 402 may be level shifted to a VIN-level of VIN supply voltage 412 by level shifter 402. Level shifter 402 may be coupled to VCC supply voltage 411 and VIN supply voltage 412 to provide such level shifting. Output of level shifter is PORVIN signal 310-1, which is provided to internal/output node 452. Node 452 is coupled to a respective first input port of one or more analog multiplexers 300 and an input port of inverter 408. Along those lines PORVIN signal 310-1 may be provided as an input to inverter 408, as well as to at least one analog multiplexer 300 for pass gating as previously described. Inverter 408, which is biased by VIN supply voltage 412, outputs PORBVIN signal 310-2, namely an inverted or complemented version of PORVIN signal 310-1. However, by inverting PORVIN signal 310-1 to provide PORBVIN signal 310-2 well-defined levels for such POR and PORB signals may be reasonably ensured during a condition where VIN supply voltage 412 ramps up before VCC supply voltage 411. PORBVIN signal 310-2 is provided to output node 453, which may be coupled to a respective second input port of at least one of analog multiplexers 300.

In the event that VIN supply voltage 412 ramps up before VCC supply voltage 411, VXX0 signal 201 may become valid before a VCC supply voltage, such as for example VCCAUX, used to operate select circuit 250-1. To avoid an error state, PORVIN signal 310-1, as well as PORBVIN signal 310-2, may not be de-asserted until VCC supply voltage 411, such as VCCAUX in the example, has ramped up at least to or above a selected threshold voltage level. Maintaining PORVIN signal 310-1, as well as PORBVIN signal 310-2, in states to keep pass gates of select circuit 350 closed to prevent VXX0 signal 201 from being passed-through select circuit 350 to select circuit 250-1, blocks VXX0 signal 201 from being passed-through to select circuit 250-1 while VCCAUX is too low. Because select circuit 350 is biased with VIN supply voltage 412, namely the same supply from which VXX0 signal 201 is generated, there is no power sequencing problem in select circuit 350 as VXX0 signal 201 is always guaranteed to only be valid after VIN supply voltage 412 has sufficiently ramped up.

Accordingly, to use one or more conventional analog multiplexers 200 of an IC with different power domains without having to bond out additional pads, voltage monitor 410 may utilize an existing POR block 401 of such an IC. Along those lines, only a level shifter 402 and an inverter 408, along with each select circuit 350, may be provided as additional dedicated hardware and/or instantiated circuitry using programmable resources, such as for example programmable fabric of an FPGA 100 of FIG. 1.

Figure 5:
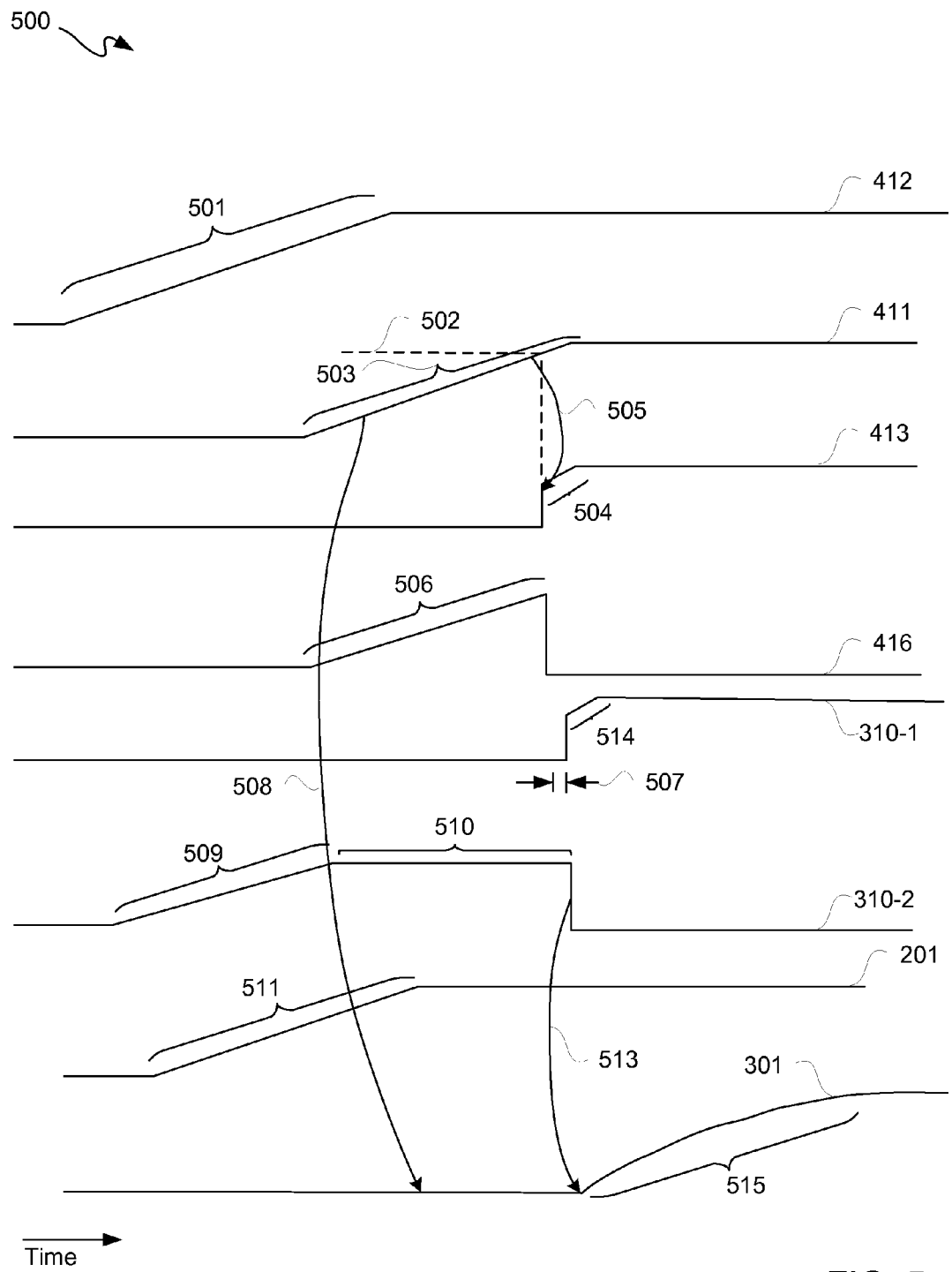
FIG. 5 is a signal diagram depicting an exemplary power sequencing.

FIG. 5 is a signal diagram depicting an exemplary power sequencing 500. In this power sequencing 500, VIN supply voltage 412 ramps up generally at 501, and VCC supply voltage 411 ramps up generally at 503, which is later in time than ramping of VIN supply voltage 412. Such power sequencing 500 is described with simultaneous reference to FIGS. 3-1, 3-2, 4, and 5, as such power sequencing 500 may be used with analog multiplexing system 400.

Because VIN supply voltage 412 may ramp up prior to VCC supply voltage 411, a threshold voltage level 502 of VCC supply voltage 411 for proper operation of select circuits 250 may not be reached until generally at a time 505, as indicated by PORVCC signal 413 transitioning from a logic low state to a logic high state. Because VCC supply voltage 411 has not fully ramped by time 505, a ramp portion 504 of PORVCC signal 413 corresponds to a last portion of ramp 503 of VCC supply voltage 411. PORBVCC signal 416 ramps up generally at 506 as associated with ramp 503 of VCC supply voltage 411; however, when threshold voltage level 502 is reached at generally at 505, PORBVCC signal 416 transitions to a logic low state.

A rising edge of PORBVIN signal 310-2 ramps up generally at 509 with ramp 501 of VIN supply voltage 412. Along those lines, this generally indicates that no sneaky current paths may exist through PMOS pass gate transistor 305-1 of select circuit 350 during a time interval in which PORBVCC signal 416 is asserted (i.e., transitions to a VCC logic high level), such as for example during ramp 506. However, once VIN supply voltage 412 reaches a threshold voltage level, PORBVIN signal 310-2 levels off at a VIN logic high level, generally for an interval 510. PORBVIN signal 310-2 transitions to a logic low level generally at 513, which may be a short time interval 507 after threshold voltage level 502 is reached by VCC supply voltage 411. PORVIN signal 310-1 transitions from a logic low level to a VIN logic high level generally a short time interval 507 after threshold voltage level 502 is reached by VCC supply voltage 411. Along those lines, PORVIN signal 310-1 after initiating such transition may have a ramp 514 corresponding to ramp 504 before reaching such logic high level, because PORVIN signal 310-1 is a level-shifted version of PORVCC signal 413.

VXX0 signal 201 may ramp generally at 511 corresponding to ramping 501 of VIN supply voltage 412. A VXX0_TX signal 301 may generally start to ramp at 513 corresponding to PORBVIN signal 310-3 transitioning to a logic low and PORVIN signal 310-1 transitioning to logic high, and such VXX0_TX signal 301 may ramp up over an interval 515. As generally indicated by line 508, VCC supply voltage 411 may always be greater than VXX0_TX signal 301.

Figure 6:
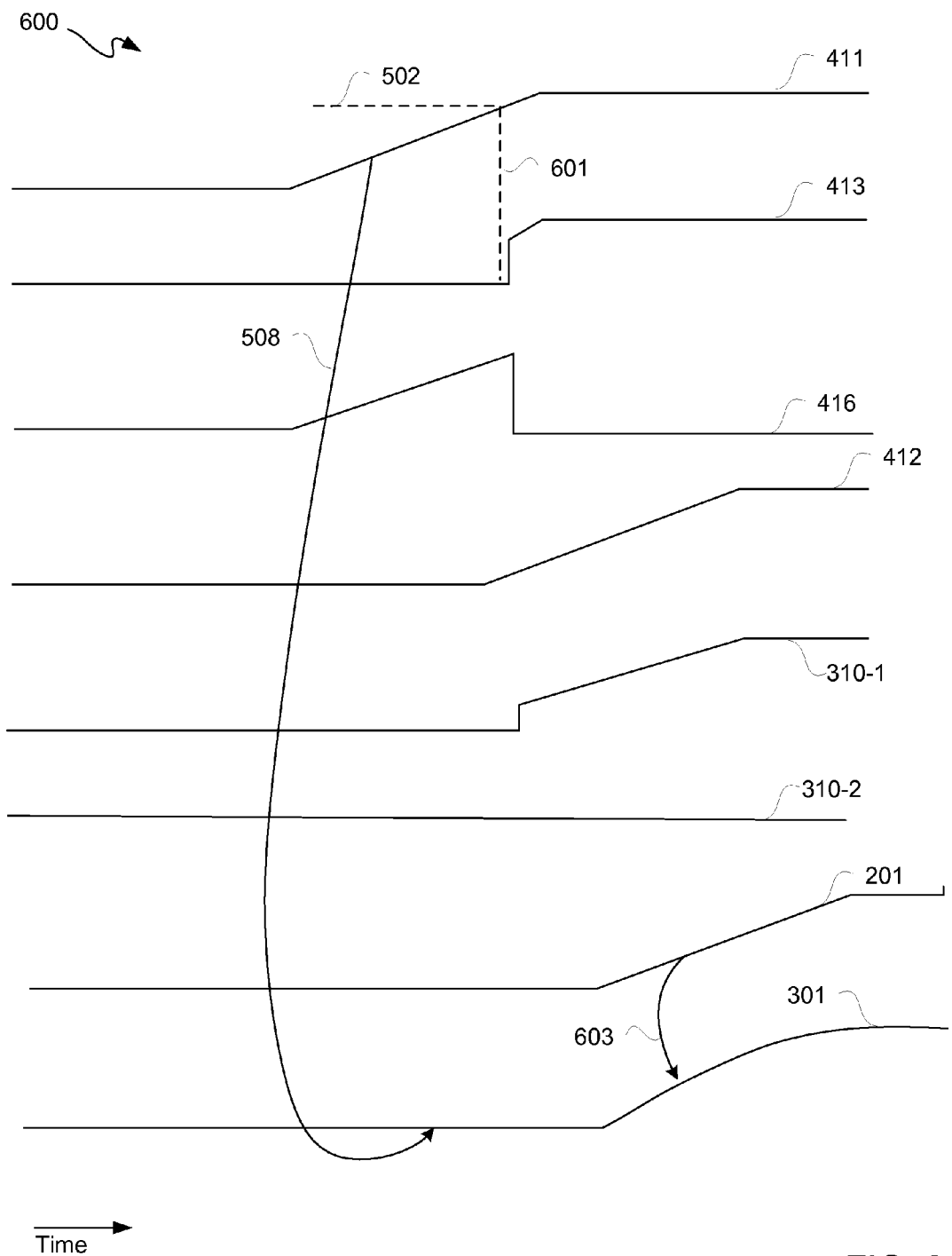
FIG. 6 is a signal diagram depicting another exemplary power sequencing.

For completeness, FIG. 6 is a signal diagram depicting another exemplary power sequencing 600. In this power sequencing 500, VIN supply voltage 412 ramps up after VCC supply voltage 411 ramps up. Power sequencing 600 is not described in unnecessary detail to avoid repetition.

Again, as generally indicated by line 508, VCC supply voltage 411 may always be greater than VXX0_TX signal 301. For VIN supply voltage 412 ramping after VCC supply voltage 411, VXX0_TX signal 301 may ramp with VXX0 signal 201, as generally indicated by line 603. Thus, for ramping of VIN supply voltage 412 lagging ramping of VCC supply voltage 411 and for ramping of VIN supply voltage leading ramping of VCC supply voltage 411, an output signal, such as for example VXX0_TX signal 301, of select circuit 350 is kept less or prevented from exceeding a voltage level of VCC supply voltage 411 at least until after VCC supply voltage 411 has ramped to a VCC logic high level. As generally indicated by dashed line 601, VIN supply voltage 412 reaches a threshold voltage level 502 of VCC supply voltage 411 prior to VCC supply voltage 411 transitioning.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. An apparatus, comprising:
   an analog multiplexer having first select circuits and at least one second select circuit;
   wherein the first select circuits have respective input nodes and output nodes;
   wherein the output nodes are all coupled to one another to provide an output node of the analog multiplexer;
   wherein the first select circuits are coupled to a first supply voltage of a first supply domain;
   wherein the at least one second select circuit is coupled to a second supply voltage of a second supply domain different from the first supply domain;
   wherein the at least one second select circuit has an input port and an output port;
   wherein the output port is coupled to an input node of the input nodes; and
   a voltage monitoring circuit coupled to receive the first supply voltage and the second supply voltage and configured to generate a power-on-reset signal and a complement of the power-on-reset signal for pass gate operation of the at least one second select circuit;
   wherein the voltage monitoring circuit comprises:
      a power-on-reset circuit coupled to receive the first supply voltage and configured to provide a first ramp-up signal of the first supply domain for the first supply voltage; and
      a level shifter coupled to receive the first ramp-up signal, the first supply voltage and the second supply voltage to provide the power-on-reset signal of the second supply domain.

2. The apparatus according to claim 1, wherein the at least one second select circuit comprises:
   a first transistor and a second transistor having a first common source/drain node as the input port and a second common source/drain node as the output port;
   a first gate of the first transistor coupled to receive the power-on-reset signal of the second supply domain; and
   a second gate of the second transistor coupled to receive the complement of the power-on-reset signal of the second supply domain.

3. The apparatus according to claim 2, wherein:
   a first body region of the first transistor is coupled to the second supply voltage; and
   a second body region of the second transistor is coupled to a ground.

4. The apparatus according to claim 2, wherein each of the select circuits comprises:
   a first transistor and a second transistor having a first common source/drain node as a respective one of the input nodes and a second common source/drain node as a respective one of the output nodes;
   a first gate of the first transistor coupled to receive a first select signal of the first supply domain; and a second gate of the second transistor coupled to receive a second select signal of the first supply domain.

5. The apparatus according to claim 4, wherein the first select signal and the second select signal are complements of one another.

6. The apparatus according to claim 4, wherein:
a first body region of the first transistor is coupled to the first supply voltage; and
a second body region of the second transistor is coupled to a ground.

7. The apparatus according to claim 1, wherein the voltage monitoring circuit further comprises a first inverter coupled to receive the power-on-reset signal and the second supply voltage to provide the complement of the power-on-reset signal of the second supply domain.

8. The apparatus according to claim 7, wherein the voltage monitoring circuit further comprises a second inverter coupled to receive the first supply voltage and the first ramp-up signal both of the first supply domain to provide a second ramp-up signal of the first supply domain.

9. A method, comprising:
providing an analog multiplexer having first select circuits and at least one second select circuit;
wherein the first select circuits have respective input nodes and output nodes;
wherein the output nodes are all coupled to one another to provide an output node of the analog multiplexer;
wherein the first select circuits are coupled to a first supply voltage of a first supply domain;
wherein the at least one second select circuit is coupled to a second supply voltage of a second supply domain different from the first supply domain;
wherein the at least one second select circuit has an input port and an output port;
wherein the output port is coupled to an input node of the input nodes;
inputting an input signal to the input port of the at least one second select circuit;
wherein the input signal is generated with the second supply voltage;
blocking passage of the input signal through the at least one second select circuit until the first supply voltage has ramped up to at least a threshold voltage level;
wherein the blocking of the passage of the input signal comprises generating a power-on-reset signal and a complement of the power-on-reset signal in the second voltage domain;
wherein the generating comprises:
providing a first ramp up signal responsive to ramping the first supply voltage; and
level shifting by a level shifter the first ramp up signal to provide the power-on-reset signal.

10. The method according to claim 9, wherein the blocking of the passage of the input signal further comprises:
pass gating the input signal by application of the power-on-reset signal and the complement of the power-on-reset signal to the at least one second select circuit.

11. The method according to claim 9, wherein the generating further comprises inverting the power-on-reset signal to provide the complement of the power-on-reset signal.

12. The method according to claim 11, wherein the generating yet further comprises inverting the first ramp up signal to provide a second ramp up signal.

13. The method according to claim 11, wherein for ramping of the second supply voltage leading ramping of the first supply voltage, ramping an output signal of the at least one second select circuit responsive to the first supply voltage having ramped up to at least the threshold voltage level.

14. The method according to claim 11, wherein for ramping of the second supply voltage lagging ramping of the first supply voltage, ramping an output signal of the at least one second select circuit responsive to ramping of the input signal.

15. The method according to claim 11, wherein for ramping of the second supply voltage lagging ramping of the first supply voltage and for ramping of the second supply voltage leading ramping of the first supply voltage, keeping an output signal of the at least one second select circuit less than the first supply voltage until after the first supply voltage has ramped to a logic high level therefor.

\* \* \* \* \*